Dec. 10, 1968 J. M. BLUM ET AL 3,414,969
CONNECTION ARRANGEMENT FOR THREE-ELEMENT COMPONENT TO
A MICRO-ELECTRONICS CIRCUIT
Filed Feb. 25, 1965

JOSEPH M. BLUM
MILTON GENSER
*INVENTORS*

BY

ATTORNEYS

United States Patent Office 3,414,969
Patented Dec. 10, 1968

3,414,969
CONNECTION ARRANGEMENT FOR THREE-ELEMENT COMPONENT TO A MICRO-ELECTRONICS CIRCUIT

Joseph M. Blum, Yorktown Heights, N.Y., and Milton Genser, Livingston, N.J., assignors, by mesne assignments, to Solitron Devices Inc., a corporation of New York Filed Feb. 25, 1965, Ser. No. 435,169
4 Claims. (Cl. 29—577)

ABSTRACT OF THE DISCLOSURE

There is described a method of attaching a three-element component, e.g., a transistor to a micro-electronic circuit. The steps comprise: forming the component out of semi-conductor material in a rectangular chip by oxide masking and diffusion; creating wide lands of electrically conductive material on the periphery of the chip and connecting the active region of the component so formed by depositing a metal film on the lands, and forming corresponding wide lands on the thin film circuit surface around the rectangular area corresponding to that of the chip. The chip is then inverted with the formed component and the chip is fused to the surface with a fusible preform.

The present invention relates to a connection arrangement for micro-electronic circuits and more particularly to an arrangement for connecting three-element components such as transistors in such circuits.

Micro-electronic circuits are presently produced by combining thin components with active element functional blocks on a substrate. In effect, two techniques are used. An integrated circuit without outside connections is produced in a monolithic block of silicon. These blocks are then coupled to thin components thus providing a hybrid thin film and monolithic circuit. Heretofore, these active devices were silicon chips with gold or aluminum lead wires and there was a very high rate of failure because of the fragility of the leads. It is, of course, possible to make a completely monolithic circuit, but then, when the block is constructed, it is impossible to add any components thereto and it is impossible to use such blocks to assemble a circuit as desired. Although many attempts may have been made to provide an arrangement whereby three-element components such as transistors can be readily incorporated into a micro-circuit, none, as far as we are aware, have ever been successful when carried out into practice.

The present invention contemplates an arrangement whereby such elements as transistors can readily be incorporated in a circuit. The invention as well as the objects and advantages thereof will be more readily apparent from the following detailed description, in which.

Figure 1:
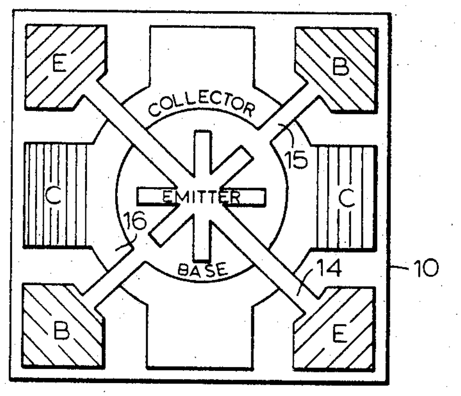
FIG. 1 illustrates a top view of the micro-size transistor contemplated herein.
Figure 2:
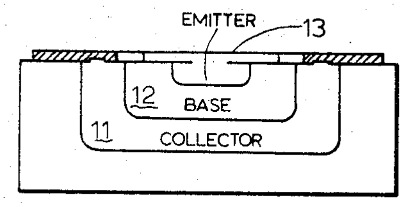
FIG. 2 is a sectional view of FIG. 1.
Figure 3:
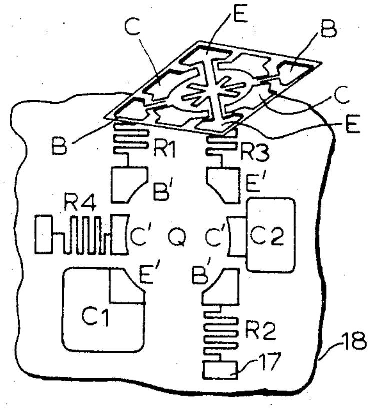
FIG. 3 is a perspective explanation of how the transistor illustrated in FIG. 1 is placed in a circuit; and, FIG. 4 shows a schematic version of the circuit of FIG. 3.
Figure 4:
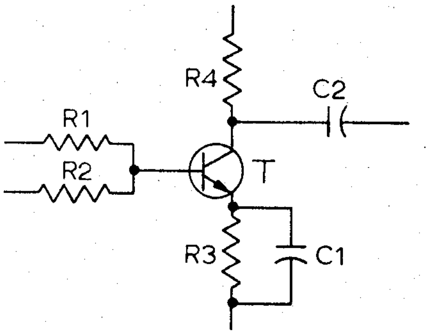

According to the present invention, a transistor 10 is fabricated in a silicon chip by the process of oxidation and diffusion which is well known in the present state-of-the-art, i.e., suitable impurities are introduced forming emitter, base and collector regions. The structure is so formed, as shown in FIG. 2 that contact to the active regions 11, 12, 13 of the device is made by metal films 14, 15, 16 which adhere to the oxide coating and these metal films terminate in broad lands B, C and E, at the periphery of the single crystal chip. Also, there is deposited on the thin film network 17 corresponding lands B′, C′ and E′. This network already has formed thereon, resistors $R_1$, $R_2$, $R_3$, $R_4$ and capacitors $C_1$ and $C_2$. All of these components and corresponding land areas are formed by deposition on a glass or ceramic substrate 18. Generally, the chip forming the transistor is of rectangular shape and the land areas B, C, and E occupy wide portions along the periphery thereof. The corresponding land areas B′, C′ and E′ on the substrate are accordingly formed so as to define therewithin a corresponding rectangle Q. The transistor chip is then inverted and the corresponding land portions are matched, i.e., B is placed over B′, C is placed over C′ and E is placed over E′ in the rectangle Q. Thus, assume that a schematic drawing which is to be used in forming a circuit shows an NPN transistor T. Base bias is supplied by resistors $R_1$ and $R_2$, and emitter and collector bias by resistors $R_3$ and $R_4$. There are also emitter and collector capacitors $C_1$ and $C_2$. A circuit corresponding to these components is deposited on the substrate, the components named, being deposited around a central area Q in exactly the same manner as shown on the schematic diagram. The leads from these components are then formed into the lands, B′, C′, E′, and the formed transistor is then inverted. The transistor chip lands are attached to the corresponding lands on the substrate 18 by use of a metal preform. The following alloys have been found suitable as a metal preform:

(I) Between about 60 parts by weight to about 65 parts tin, between about 35 parts to about 40 parts lead, melting at about 180° C.

(II) Between about 3 parts by weight to about 5 parts silver, between about 5 parts to about 17 parts tin, and between about 80 parts to about 90 parts lead, melting at about 311° C.

(III) Between about 80 parts by weight to about 90 parts gold, between about 10 parts to about 20 parts germanium, melting at about 370° C.

(IV) Between about 90 parts by weight to about 95 parts gold, between about 5 parts to about 10 parts silicon, melting at about 370° C.

Suitable metal films for the thin film boards may be nickel, nickel coated with gold or chromium coated with gold or chromium coated with gold. These metals are also used for the films on the silicon.

It is to be observed that the present invention provides for a method of attaching a three-element component, e.g., a transistor to a micro-electronic circuit and comprises the steps of forming the desired component out of semi-conductor material in a rectangular chip of such material by oxide masking and diffusion; creating wide lands of electrically conductive material on the periphery of the chip and connecting the active region of the component so formed by depositing a metal film to said lands; forming corresponding wide lands on a thin film circuit surface around a rectangular area corresponding to that of the chip; inverting the chip with the formed component; and fusing the chip to the surface with a fusible preform. When the component is a transistor, the collector, base and emitter electrodes extend out to wide land areas on the periphery of the rectangle.

While there has been described what at present is believed to be the preferred embodiment of this invention, it will be obvious to those skilled in the art that various changes and modifications may be made therein without departing from the invention, and it is aimed, therefore, to cover in the appended claims all such changes and modifications as fall within the true spirit and scope of the invention.

What is claimed is:

1. A method of attaching a three-element component to a micro-electronic circuit, comprising the steps of:

forming a desired component out of semi-conductor material in a rectangular chip of such material by oxide masking and diffusion:

creating at least a pair of wide lands of electrically conductive material on the periphery of the chip extending diagonally from the active regions of the component for each of said elements and connecting active regions of the component so formed by depositing a metal film to said lands;

forming corresponding wide lands on a thin film circuit surface around a rectangular area corresponding to that of the chip;

inverting the chip with the formed component; and fusing the chip to the surface with a fusible preform comprising an alloy containing between 60 parts by weight to about 65 parts tin, and between about 35 parts by weight to about 40 parts lead.

2. A method of attaching a three-element component to a micro-electronic circuit, comprising the steps of:

forming a desired component out of semi-conductor material in a rectangular chip of such material by oxide masking and diffusion: creating at least a pair of wide lands of electrically conductive material on the periphery of the chip extending diagonally from the active regions of the component for each of said elements and connecting active regions of the component so formed by depositing a metal film to said lands;

forming corresponding wide lands on a thin film circuit surface around a rectangular area corresponding to that of the chip;

inverting the chip with the formed component; and fusing the chip to the surface with a fusible preform comprising an alloy containing between about 3 parts by weight to about 5 parts silver, between about 5 parts to about 17 parts tin, and between about 80 parts to 90 parts lead.

3. A method of attaching a three-element component to a micro-electronic circuit, comprising the steps of:

forming a desired component out of semi-conductor material in a rectangular chip of such material by oxide masking and diffusion: creating at least a pair of wide lands of electrically conductive material on the periphery of the chip extending diagonally from the active regions of the component for each of said elements and connecting active regions of the component so formed by depositing a metal film to said lands;

forming corresponding wide lands on a thin film circuit surface around a rectangular area corresponding to that of the chip;

inverting the chip with the formed component; and fusing the chip to the surface with a fusible preform comprising an alloy containing between 80 parts by weight to about 90 parts gold and between about 10 parts to about 20 parts germanium.

4. A method of attaching a three-element component to a micro-electronic circuit, comprising the steps of:

forming a desired component out of semi-conductor material in a rectangular chip of such material of oxide masking and diffusion: creating at least a pair of wide lands of electrically conductive material on the periphery of the chip extending diagonally from the active regions of the component for each of said elements and connecting active regions of the component so formed by depositing a metal film to said lands;

forming corresponding wide lands on a thin film circuit surface around a rectangular area corresponding to that of the chip;

inverting the chip with the formed component; and fusing the chip to the surface with a fusible preform comprising an alloy containing betwen about 90 parts by weight to about 95 parts gold and between about 5 parts to about 10 parts silicon.

References Cited

UNITED STATES PATENTS

| | | | |
|---|---|---|---|
| 2,981,877 | 4/1964 | Noyce. | |
| 3,141,135 | 7/1964 | Amlinger et al. | |
| 3,289,046 | 11/1966 | Carr | 29—577 X |
| 3,316,458 | 4/1967 | Jenny. | |
| 3,065,534 | 11/1962 | Marino | 29—501 X |
| 3,292,240 | 12/1966 | McNutt | 29—155.5 |
| 3,292,241 | 12/1966 | Carroll | 29—155.5 |

OTHER REFERENCES

IBM Technical Disclosure Bulletin, vol. 3, No. 12 May 1961; pp. 30 and 31.

WILLIAM I. BROOKS, *Primary Examiner.*

U.S. Cl. X.R.

29—501, 504, 589, 590; 317—101